United States Patent [19]
Kawada

[11] 3,932,806
[45] Jan. 13, 1976

[54] SURGE COMPARISON TYPE COIL TESTER

[76] Inventor: Tadao Kawada, 1356-7, Kawaguchi-cho, Hachioji, Tokyo, Japan

[22] Filed: Oct. 4, 1974

[21] Appl. No.: 512,288

[30] Foreign Application Priority Data
Nov. 14, 1973 Japan............. 48-130704[U]

[52] U.S. Cl.................................. 324/51; 324/59
[51] Int. Cl.² ........................................ G01R 27/26
[58] Field of Search........... 324/51, 55, 59, 158 MG

[56] References Cited
UNITED STATES PATENTS
3,869,664 3/1975 Safer et al............................ 324/51

Primary Examiner—James B. Mullins
Attorney, Agent, or Firm—Frank J. Jordan

[57] ABSTRACT

Low voltage pulses are applied to a pulse transformer to produce high voltage pulses, which are in turn applied through a capacitor and a diode to the coil under test and to a standard reference coil. The waveforms of the resulting surge currents through the test and reference coils are superimposed on a cathode ray tube, and the test coil is judged defective if the waveforms are substantially different. A resistor is connected in parallel with the capacitor to discharge the capacitor between pulses, and the diode prevents the capacitor from discharging through the coils. The high voltage pulses may be applied alternately to the coils and the waveforms displayed on a single beam cathode ray tube, or simultaneously and the waveforms displayed on a dual beam cathode ray tube.

11 Claims, 12 Drawing Figures

SURGE COMPARISON TYPE COIL TESTER

The present invention relates to a surge comparison type coil tester to test an electrical coil for defects.

Surge comparison type coil testers are known in the art for testing electrical coils for defects such as improper connections, shorts, opens, corona discharge, poor insulation, wrong number of turns and the like. Electrical coils to which these testers are applicable are found in transformers, electric motors, relays, and a number of other electrical devices. In such testers, a capacitor is charged to a high voltage and subsequently discharged through the coil under test and also through a standard reference coil of the same specifications as the test coil and which is free from defects. The waveforms of the resulting surges of current through the two coils are superimposed on a cathode ray tube, and the test coil is judged defective if the waveforms are substantially different. Generally, the capacitor is discharged alternately through the test and reference coils by means of thyratron tubes or semiconductor controlled rectifiers (SCR's). It is to be noted that thyratron tubes contain mercury, which is undesirable as an atmospheric pollutant. Regarding the use of SCR's, they are generally applicable to voltages of up to 2 kilovolts, and it is often necessary to apply voltages of higher than 2 kilovolts to coils using a surge comparison type coil tester. Although two or more SCR's may be connected in series to increase the voltage capacity, serious problems are encountered in triggering the SCR's simultaneously. Also, the SCR's must be perfectly matched in electrical characteristics. SCR's are generally delicate in construction, and subject to breakage under the severe conditions in which a portable coil tester is required to operate. Naturally, the failure of one SCR in a series circuit will result in failure of the entire circuit as an operable unit. Abnormal current flow at the instant of conduction of SCR's also results in abnormal surge currents flowing through coils being tested by such a comparison tester.

It is therefore an object of the present invention to provide a novel and effective method of testing electrical coils for defects which overcomes the drawbacks of the prior art described above.

It is another object of the present invention to provide a surge comparison type coil tester comprising a novel surge current generating circuit embodying the above method which is more effective in operation than prior art coil testers of similar types and which does not include thyratrons or SCR's.

It is a still further object of the present invention to provide the novel surge current generating circuit mentioned above which may be advantageously incorporated into known coil testers.

The above and other objects, features and advantages of the present invention will become more clear from the following detailed description taken in conjunction with the accompanying drawings, in which.

Figure 1:
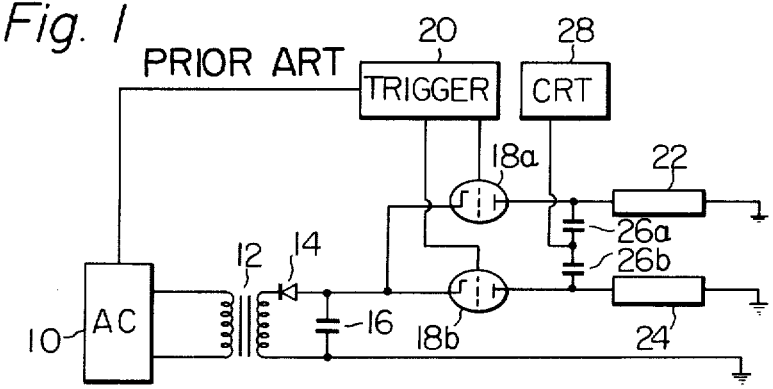
FIG. 1 is a schematic diagram of a prior art surge comparison type coil tester.

Referring now to the drawings and particularly to FIG. 1, a prior art surge comparison type coil tester comprises an AC power source 10 connected to the primary winding of a transformer 12.

The secondary winding of the transformer 12 is connected in series with a diode 14 and a capacitor 16, with the anode of the diode 14 connected to the capacitor 16. In operation, the AC voltage from the source 10 is stepped up by the transformer 12 to a high voltage which is rectified by the diode 14 and charges the capacitor 16 so that the junction between the capacitor 16 and diode 14 assumes a high negative voltage with respect to the grounded side of the capacitor 16 and secondary winding of the transformer 12.

The junction of the capacitor 16 and diode 14 is connected to the cathodes of thyratrons 18a and 18b, the grids of which are connected to a trigger circuit 20. The plate of the thyratron 18a is connected to one end of an electrical coil 22 under test (test coil), the other end of which is grounded. The plate of the thyratron 18b is connected to one end of a reference coil 24, the other end of which is grounded. The coils 22 and 24 have the same electrical specifications (are of identical type), but the reference coil 24 has been previously tested and found to be without any defects. The trigger circuit 20 receives an input from the AC source 10. Capacitors 26a and 26b are connected in series to the plates of the thyratrons 18a and 18b respectively. A cathode ray tube 28 is connected to the junction of the capacitors 26a and 26b which serves as a display unit.

In operation, the trigger circuit 20 is activated at a rate of 50 or 60 times per second by the power source 10 (the power source 10 may be a public power station) and applies a voltage alternately to the grids of the thyratrons 18a and 18b causing the same to conduct. The capacitor 16 will thereby discharge through the coils 22 and 24 alternately and charge in the time intervals between activations of the trigger circuit 20. The waveforms of the resulting surge currents through the coils 22 and 24 will appear alternately on the cathode ray tube 28 in superimposed form. If the electrical characteristics of the coils 22 and 24 are identical (the test coil 22 is not defective), the surge current waveforms will be substantially identical and appear in superimposed form as a single waveform. If, however, the coil 22 is defective in some way, the current waveforms will be different. A defect in the coil 22 can be identified from the shape of the resulting waveform of the coil 22.

Figure 2:
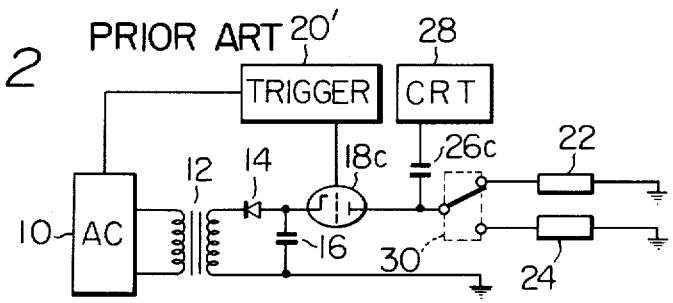
FIG. 2 is a schematic diagram of another prior art coil tester.
Figure 3:
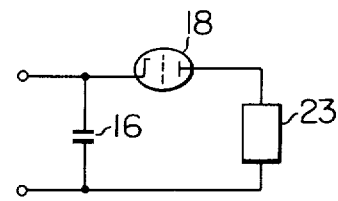
FIG. 3 is a schematic diagram of the main portion of the coil tester of FIG. 2.

FIG. 2 shows a modified version of the prior art testor of FIG. 1, in which like elements are designated by the same reference numerals. The thyratrons 18a and 18b are replaced by a single thyratron 18c, which is triggered by a trigger circuit 20' at 50 or 60 times per second. The cathode ray tube 28 is connected to the plate of the thyratron 18c through a capacitor 26c. A movable contact of a switch 30 is connected to the plate of the thyratron 18c, and is arranged to contact fixed contacts of the switch 30 connected to the coils 22 and 24. The switch 30 is preferably actuated by a synchronous motor (not shown) driven by the power source 10 in such a manner that the switch 30 alternately connects the coils 22 and 24 to the thyratron 18c in simultaneity with the activation of the trigger circuit 20' which causes the thyratron 18c to conduct. As a result, surge currents are alternately produced in the coils 22 and 24, and the waveforms appear on the cathode ray tube 28 as described with reference to FIG. 1. FIG. 3 shows the discharge circuit of the capacitor 16 in enlarged scale, and the numeral 23 designates the coils 22 and 24 and switch 30 as a unit.

Figure 4:
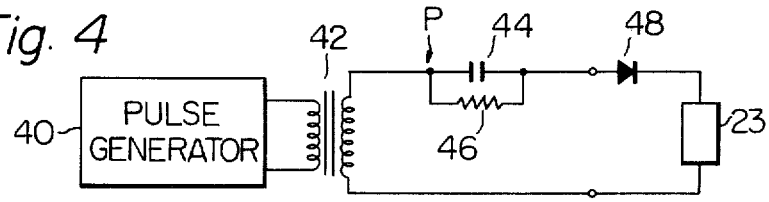
FIG. 4 is a schematic diagram of a surge comparison type coil tester embodying the present invention.

FIG. 4 shows a preferred embodiment of the present invention in simplified form to illustrate the principle thereof. A low voltage pulse generator 40 is connected to the primary winding of a pulse transformer 42, one end of the secondary winding of which is connected to one end of a capacitor 44. A resistor 46 is connected in parallel with the capacitor 44. The other end of the capacitor 44 is connected to the anode of a rectifying element or diode 48, the cathode of which is connected to the coils 23. The other end of the pulse transformer secondary winding is connected to the coils 23 to complete a series circuit. The capacitor 44 and coils 23 constitute a differentiating circuit, and if the impedance of the coils 23 is low, a resistor (not shown) may be connected in series therewith to increase the time constant.

Figure 5A:
FIG. 5 is a timing diagram of the tester of FIG. 4.
Figure 5B:
Figure 5C:
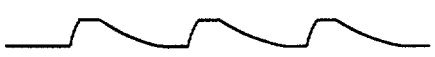
Figure 5D:

In operation, the pulse generator 40 generates low voltage pulses such as shown in FIG. 5a, which are stepped up by the pulse transformer 42 to provide high voltage pulses as shown in FIG. 5b. A high positive pulse voltage appearing at a point P in FIG. 4 causes the diode 44 to conduct and current to flow in the circuit to charge the capacitor 44 as shown in FIG. 5c. A high initial current flows through the coils 23, but decreases rapidly as the capacitor 44 charges as shown in FIG. 5d. The capacitor 44 discharges through the resistor 46 in the time interval between pulses, and discharge through the coils 23 in prevented by the diode 48.

It will be recognized by one skilled in the art that if the resistor 46 were omitted, the capacitor 44 had the same value as the capacitor 16 of FIG. 1 and the charge voltage across the capacitor 16 were identical to the voltage of the pulses shown in FIG. 5b, the current flowing through the coils 23 produced by the embodiment of the present invention shown in FIG. 4 would have the same waveform as that produced by the prior art tester shown in FIG. 1. The present invention, however, provides this waveform without thyratrons, SCR's or trigger circuits, and is therefore a major improvement over the prior art. In practice, due to the provision of the resistor 46, the waveforms of the testers of FIGS. 1 and 4 are slightly different depending on the value of the resistor 46, but they are quite similar, and the waveform produced by the present testor of FIG. 4 is highly suitable for the application.

Figure 6:
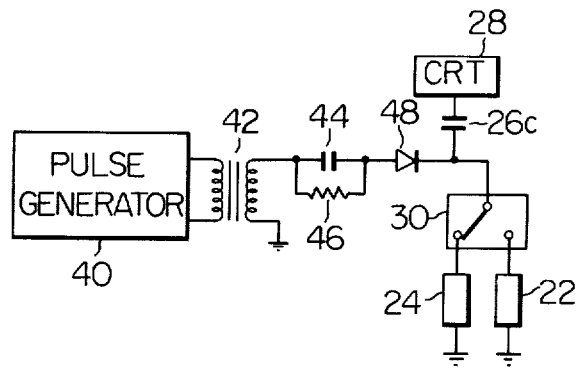
FIG. 6 is a schematic diagram of a modification of the tester of FIG. 4.

Referring now to FIG. 6, the embodiment of FIG. 4 is shown in more detail, and the additional components are those shown and described with reference to FIG. 2. In operation, a slightly modified synchronous motor (not shown) is driven in synchronism with the pulses from the pulse generator 40 to actuate the switch 30, and the high voltage pulses from the pulse transformer 42 are differentiated by the combination of the capacitor 44 and coils 23. The pulses are applied alternately to the coils 22 and 24 by means of the switch 30 similar to the prior art tester of FIG. 2.

Figure 7:
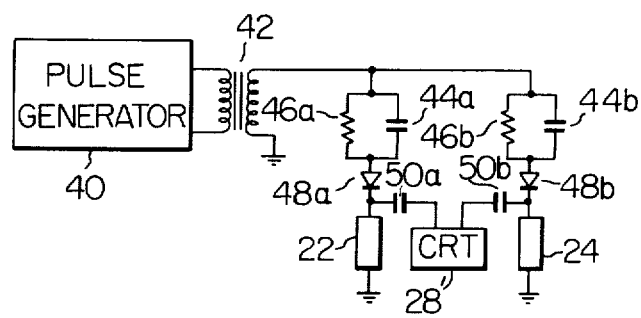
FIG. 7 is a schematic diagram of another modification of the tester of FIG. 4.

FIG. 7 shows a modified version of the present invention in which the pulses are applied simultaneously rather than alternately to the coils 22 and 24. A first series circuit comprises the secondary winding of the pulse transformer 42, a capacitor 44a, a diode 48a and the coil 22 connected as described with reference to FIG. 4. A second series circuit in parallel with and similar to the first series circuit comprises a capacitor 44b, a diode 48b and the coil 24. Resistors 46a and 46b are connected in parallel with the capacitors 44a and 44b respectively. In this embodiment, a dual beam cathode ray tube 28' is provided, and the two beams are connected to the cathodes of the diodes 48a and 48b through capacitors 50a and 50b respectively.

In operation, the high voltage pulses of FIG. 5b are applied across the first and second series circuits, causing surge currents to flow through the coils 22 and 24 simultaneously. The waveforms of these currents are superimposed on the cathode ray tube 28' by the two beams respectively.

Figure 8:
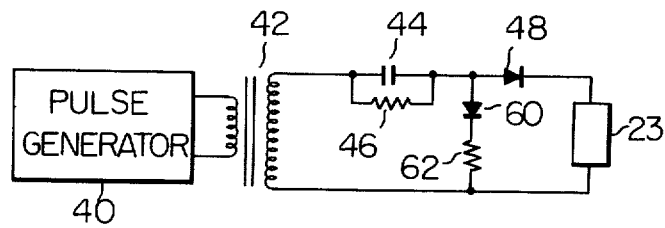
FIG. 8 is a schematic diagram of another modification of the tester of FIG. 4.

FIG. 8 is identical to FIG. 4 except that a diode 60 and resistor 62 are connected in series with each other and in parallel with the coils 23. More specifically, the anode of the diode 60 is connected to the anode of the diode 48 and the resistor is connected to the junction between the pulse transformer 42 and coils 23. The charging time constant of the capacitor 44 can be reduced to a selected value by selection of the value of the resistor 62, and the diode 60 prevents the capacitor 44 from discharging through the resistor 62 and pulse transformer 42.

Figure 9:
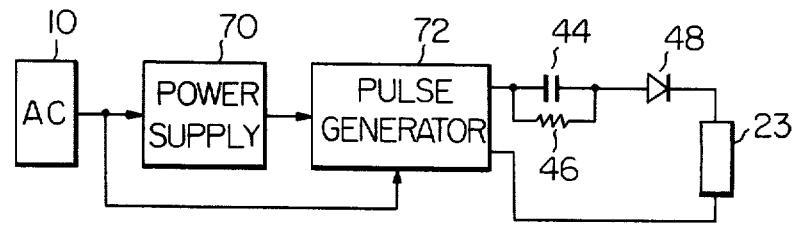
FIG. 9 is a schematic diagram of still another modification of the tester of FIG. 4.

Within the scope of the present invention, the pulses shown in FIG. 5b may be produced by any means, such as illustrated in FIG. 9. Here, the pulse transformer 42 is omitted. Instead, the AC power source 10 is connected to a high voltage power supply 70, which comprises a high voltage transformer and rectifier (not shown) to produce a high DC voltage from the AC input. The output of the power supply 70 is connected to a pulse generator 72 which is triggered by the AC voltage from the source 10. The pulse generator 72 comprises high voltage switching elements (not shown) which are triggered by the AC from the source 10 to produce the pulses shown in FIG. 5b, which are fed to the coils 23 as described with reference to FIG. 4.

Although in the preferred embodiment of the invention shown in FIG. 4 the differentiating circuit to produce the surge currents through the coils 23 is constituted by the capacitor 44 and the coils 23 themselves, any alternate differentiating circuit may be provided within the scope of the present invention. A surge current generator according to the present invention comprises a source of electrical pulses (preferably high voltage) and differentiating means to differentiate the pulses and apply the differentiated pulses to the coils.

What is claimed is:

1. In a surge comparison type coil tester in which surges of electrical current are passed through a reference coil and a test coil and the current waveforms compared using display means, the test coil being judged free from defects if the waveforms are substantially identical and defective if the waveforms differ substantially from each other, the improvement of a surge current generator for generating and passing the surges of current through the reference coil and test coil, said surge current generator comprising:

an electrical pulse generator; and differentiating means connected to the pulse generator arranged to differentiate the electrical pulses generated by the pulse generator and apply the differentiated pulses to the reference coil and the test coil to cause the surges of current to pass therethrough, the display means being adapted to be connected to the reference coil and the test coil to display the current waveforms thereof.

2. A method of testing an electrical coil for defects, comprising the steps of:
generating electrical pulses;
differentiating the electrical pulses;
applying the differentiated pulses to the electrical coil and also to a reference coil of identical specifications as the electrical coil, the reference coil being free from defects, to produce surges of electrical current through the electrical coil and reference coil; and
comparing the waveforms of the current through the electrical coil and reference coil, the electrical coil being judged free from defects if the current waveforms are substantially identical and defective if the current waveforms substantially differ from each other.

3. A surge comparison type coil tester for testing an electrical coil for defects, comprising:
an electrical pulse generator;
a capacitor and a resistor connected in parallel with each other;
a rectifying element;
means operative to connect the electrical coil in series with the pulse generator, capacitor and resistor and rectifying element, the means also being operative to connect a reference coil in series with the pulse generator, capacitor and resistor and rectifying element, the reference coil having the same specifications as the electrical coil and being free from defects; and
a display unit operatively adapted to be connected to the electrical coil and the reference coil to display the waveforms of the current therethrough; whereby
electrical pulses from the pulse generator are applied through the capacitor, resistor, rectifying element and means to the electrical coil and reference coil and the resulting surges of current through the reference coil and electrical coil are displayed using the display means, the capacitor discharging through the resistor between electrical pulses and being prevented from discharging through the reference and electrical coils by the rectifying element, the electrical coil being judged free from defects if the current waveforms of the reference coil and the electrical coil are substantially identical and defective if the waveforms substantially differ from each other.

4. A tester according to claim 3, in which the pulse generator comprises a low voltage pulse generator and a pulse transformer connected to step up the low voltage pulses from the low voltage pulse generator to produce high voltage pulses.

5. A tester according to claim 3, in which the means is arranged to alternately connect the reference coil and electrical coil in series with the pulse generator, capacitor and resistor and rectifying element in simultaneity with respectively alternating electrical pulses.

6. A tester according to claim 3, further comprising a second rectifying element and a second resistor connected in series with each other in parallel with the reference coil and electrical coil, the second rectifying element being connected to prevent the capacitor from discharging through the second resistor; whereby
the time constant of the tester may be set to a desired predetermined value by selection of the value of the second resistor.

7. A tester according to claim 5, in which the means comprises a switch.

8. A tester according to claim 5, in which the display unit is arranged to superimpose the waveforms of the current through the reference coil and electrical coil.

9. A surge comparison type coil tester for testing an electrical coil for defects, comprising:
an electrical pulse generator;
a first capacitor, a first resistor and a first rectifying element, the first capacitor being connected in parallel with the first resistor and in series with the first rectifying element, the electrical coil and the pulse generator;
a second capacitor, a second resistor and a second rectifying element, the second capacitor being connected in parallel with the second resistor and in series with the second rectifying element, the pulse generator and a reference coil, the reference coil having the same specifications as the electrical coil and being free from defects; and
a display unit connected to the electrical coil and the reference coil and operative to display the waveforms of the current therethrough; whereby
the electrical pulses from the pulse generator are applied simultaneously through the first capacitor, first resistor and first rectifying element to the electrical coil and through the second capacitor, second resistor and second rectifying element to the reference coil, and the resulting surges of current through the electrical coil and reference coil are displayed using the display means, the first and second capacitors discharging through the first and second resistors respectively between electrical pulses and being prevented from discharging through the electrical coil and reference coil by the first and second rectifying elements respectively, the electrical coil being judged free from defects if the current waveforms of the reference coil and the electrical coil are substantially identical and defective if the waveforms substantially differ from each other.

10. A tester according to claim 9, in which the display unit is a dual beam cathode ray tube, and the two beams are connected to display the current waveforms of the electrical coil and the reference coil respectively.

11. A tester according to claim 10, in which the two beams are arranged to superimpose the waveforms of the electrical coil and the reference coil respectively.

* * * * *